United States Patent
Ikeuchi et al.

(10) Patent No.: US 12,389,798 B2
(45) Date of Patent: Aug. 12, 2025

(54) PIEZOELECTRIC DEVICE

(71) Applicant: Murata Manufacturing Co., Ltd., Nagaokakyo (JP)

(72) Inventors: Shinsuke Ikeuchi, Nagaokakyo (JP); Fumiya Kurokawa, Nagaokakyo (JP); Seiji Umezawa, Nagaokakyo (JP); Masayuki Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 785 days.

(21) Appl. No.: 17/724,759

(22) Filed: Apr. 20, 2022

(65) Prior Publication Data
US 2022/0246831 A1    Aug. 4, 2022

Related U.S. Application Data

(63) Continuation of application No. PCT/JP2020/027583, filed on Jul. 16, 2020.

(30) Foreign Application Priority Data

Nov. 25, 2019  (JP) ................. 2019-212041

(51) Int. Cl.
*H10N 30/20*   (2023.01)
*H10N 30/87*   (2023.01)
*H10N 30/88*   (2023.01)

(52) U.S. Cl.
CPC ....... *H10N 30/2042* (2023.02); *H10N 30/204* (2023.02); *H10N 30/87* (2023.02); *H10N 30/88* (2023.02)

(58) Field of Classification Search
CPC ...... F04B 15/02; F04B 1/0452; F04B 1/0538; F04B 53/1022; F04B 53/1032; F04B 7/0266
See application file for complete search history.

(56) References Cited

U.S. PATENT DOCUMENTS 5,633,552 A    5/1997  Lee et al.
8,710,716 B2 * 4/2014  Fujii ................... H10N 30/081
                                                310/330

(Continued)

FOREIGN PATENT DOCUMENTS

JP    2006-157226 A    6/2006
JP    2008-227211 A    9/2008

(Continued)

OTHER PUBLICATIONS

Official Communication issued in International Patent Application No. PCT/JP2020/027583, mailed on Sep. 29, 2020.

*Primary Examiner* — Bryan M Lettman
(74) *Attorney, Agent, or Firm* — Keating & Bennett, LLP

(57) ABSTRACT

A piezoelectric device includes a beam portion with a fixed end portion and a free end portion opposite to the fixed end portion. The beam portion extends from the fixed end portion towards the free end portion. The beam portion includes a multilayer body including a piezoelectric layer and first and second electrode layers. A base is connected with the fixed end portion of the beam portion. As viewed from a layering direction of the multilayer body, the base surrounds the beam portion at an interval from the beam portion except for the fixed end portion. As viewed from the layering direction, an average of a dimension of a width of the beam portion in an orthogonal or substantially orthogonal direction to an extension direction of the beam portion is greater than a maximal dimension of a length thereof in the extension direction.

15 Claims, 8 Drawing Sheets

(56) References Cited

U.S. PATENT DOCUMENTS

| | | | |
|---|---|---|---|
| 2002/0179984 A1 | 12/2002 | Ren et al. | |
| 2012/0250909 A1 | 10/2012 | Grosh et al. | |
| 2017/0036044 A1* | 2/2017 | Ito | H10N 30/057 |
| 2017/0309808 A1* | 10/2017 | Hada | H10N 30/2047 |
| 2018/0188212 A1 | 7/2018 | Ono et al. | |

FOREIGN PATENT DOCUMENTS

| | | |
|---|---|---|
| JP | 2014-515214 A | 6/2014 |
| JP | 2017-022576 A | 1/2017 |
| JP | 2017-041824 A | 2/2017 |
| WO | 2016/114173 A1 | 7/2016 |

\* cited by examiner

PIEZOELECTRIC DEVICE

CROSS REFERENCE TO RELATED APPLICATIONS

This application claims the benefit of priority to Japanese Patent Application No. 2019-212041 filed on Nov. 25, 2019 and is a Continuation Application of PCT Application No. PCT/JP2020/027583 filed on Jul. 16, 2020. The entire contents of each application are hereby incorporated herein by reference.

BACKGROUND OF THE INVENTION

1. Field of the Invention

The present invention relates to piezoelectric devices.

2. Description of the Related Art

Japanese Unexamined Patent Application Publication No. 2014-515214, U.S. Pat. No. 5,633,552, and Japanese Unexamined Patent Application Publication No. 2017-041824 disclose configurations of piezoelectric devices.

A piezoelectric device described in Japanese Unexamined Patent Application Publication No. 2014-515214 is a MEMS transducer, including a substrate and multiple cantilevers. The cantilevers are tapered and adjacent to each other. Each cantilever defines a beam proximal end portion, a beam distal end portion, and a beam body portion. The beam body portion is positioned between the beam proximal end portion and the beam distal end portion. The cantilevers are positioned so that their respective beam distal end portions extend toward a common virtual point. Each cantilever is coupled to the substrate along the beam proximal end portion but is not coupled to the substrate along the beam body portion.

A piezoelectric device described in U.S. Pat. No. 5,633,552 is a micromechanical device, including a frame and at least one cantilever structure. The frame has a cavity. The cantilever structure is attached to the frame over a portion of a periphery of the cavity. The cantilever structure covers most of the cavity. The cantilever structure includes three sublayers. The three sublayers include a first sublayer, a second sublayer, and a third sublayer. The second sublayer is adjacent to the first sublayer and the third sublayer. The first sublayer and the third sublayer are formed of a substantially same first material and have a substantially same mean stress. The second sublayer is formed of a second material and has a minimum stress and a maximum stress. A difference between the maximum stress and the minimum stress is smaller than a magnitude of the mean stress of the first sublayer. The cavity may be square-shaped.

A piezoelectric device described in Japanese Unexamined Patent Application Publication No. 2017-041824 is a detection device for detecting an acoustic wave propagating via air and has a cantilever structure. The cantilever structure has a fixed end and a free end. The cantilever structure has a first electrode and a second electrode. The first electrode is plate-shaped and vibrates by being bent by the acoustic wave. The second electrode is plate-shaped and is opposed to the first electrode across a predetermined distance. The cantilever structure detects the acoustic wave based on a change in electrostatic capacity between the first electrode and the second electrode. The end of the second electrode in a direction from the fixed end toward the free end is located on the fixed end side relative to the free end.

The piezoelectric device described in Japanese Unexamined Patent Application Publication No. 2014-515214 has multiple cantilevers. When the piezoelectric device is driven, the respective ones of these multiple cantilevers may vibrate with different phases from one another. In such a case, device characteristics of the piezoelectric device would deteriorate conversely. The piezoelectric devices described in U.S. Pat. No. 5,633,552 and Japanese Unexamined Patent Application Publication No. 2017-041824 each have one cantilever structure, that is, a cantilever beam portion. However, a piezoelectric device with a single beam portion has lower device characteristics because a force with which a medium around the beam portion is pushed out is small compared to that of a piezoelectric device having multiple beam portions.

Accordingly, for a piezoelectric device with a single beam portion, it is conceivable to improve the device characteristics by increasing an area of the beam portion when seen in a direction of vibration of the beam portion. However, increasing the area of the beam portion can lead to a reduction in a specific resonant frequency possessed by the beam portion.

SUMMARY OF THE INVENTION

Preferred embodiments of the present invention provide piezoelectric devices that are each able to improve device characteristics while reducing or preventing changes in a resonant frequency of a beam portion.

A piezoelectric device according to a preferred embodiment of the present invention includes a single beam portion and a base. The beam portion includes a fixed end portion and a free end portion. The free end portion is located opposite to the fixed end portion. The beam portion extends from the fixed end portion toward the free end portion. The beam portion includes a multilayer body. The multilayer body includes a piezoelectric layer, a first electrode layer, and a second electrode layer. The first electrode layer is on one side of the piezoelectric layer. The second electrode layer is opposed to at least a portion of the first electrode layer across the piezoelectric layer. The base is connected with the fixed end portion of the beam portion. Seen from a layering direction of the multilayer body, the base surrounds the beam portion at an interval from the beam portion except for the fixed end portion. The base is annular. Seen from the layering direction, an average of a dimension of a width of the beam portion in an orthogonal or substantially orthogonal direction to an extension direction of the beam portion is greater than a maximal dimension of a length thereof in the extension direction.

According to preferred embodiments of the present invention, the device characteristics are able to be improved while reducing or preventing changes in the resonant frequency of the beam portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
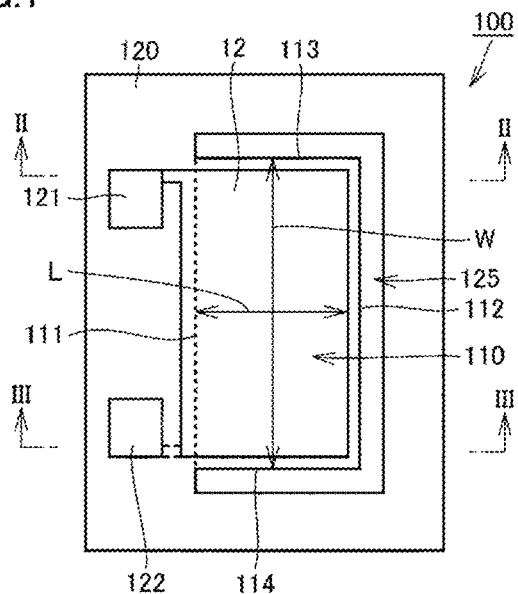
FIG. 1 is a plan view of a piezoelectric device according to a first preferred embodiment of the present invention.

Piezoelectric devices according to preferred embodiments of the present invention are now described with reference to the drawings. In the description of the preferred embodiments below, the same or equivalent portions in the drawings are denoted by the same reference characters and description thereof is not repeated.

First Preferred Embodiment

Figure 2:
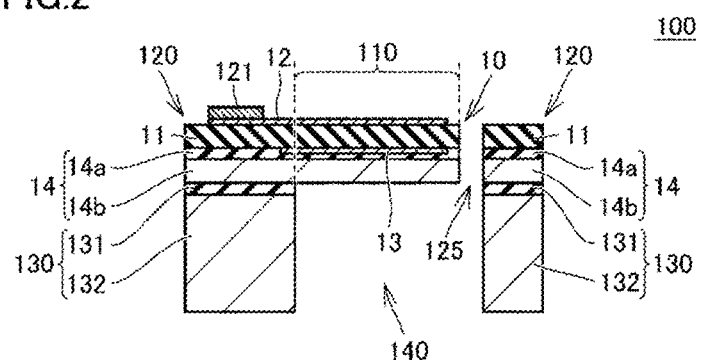
FIG. 2 is a sectional view of the piezoelectric device of FIG. 1 as seen from the direction of II-II line arrows.
Figure 3:
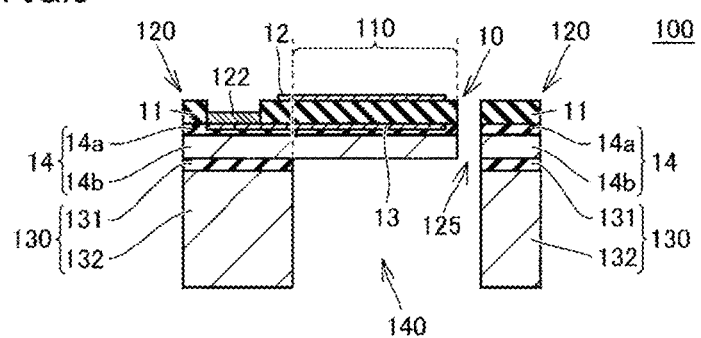
FIG. 3 is a sectional view of the piezoelectric device of FIG. 1 as seen from the direction of line arrows.

FIG. 1 is a plan view of a piezoelectric device according to a first preferred embodiment of the present invention. FIG. 2 is a sectional view of the piezoelectric device of FIG. 1 as seen from the direction of II-II line arrows. FIG. 3 is a sectional view of the piezoelectric device of FIG. 1 as seen from the direction of line arrows.

As shown in FIGS. 1 to 3, a piezoelectric device 100 according to the first preferred embodiment of the present invention includes a single beam portion 110, a base 120, a base supporting portion 130, and a cavity 140.

As shown in FIGS. 2 and 3, the beam portion 110 includes a multilayer body 10. As shown in FIG. 1, the beam portion 110 includes a fixed end portion 111, a free end portion 112, a first-side end portion 113, and a second-side end portion 114. The free end portion 112 is located opposite to the fixed end portion 111. As shown in FIGS. 1 to 3, in the present preferred embodiment, the fixed end portion 111 and the free end portion 112 are parallel or substantially in parallel to each other as seen from a layering direction of the multilayer body 10. It is also possible that the fixed end portion 111 and the free end portion 112 are not parallel or substantially parallel to each other. The beam portion 110 extends from the fixed end portion 111 toward the free end portion 112.

As shown in FIG. 1, in the present preferred embodiment, the first-side end portion 113 extends from one end of the fixed end portion 111 linearly along an extension direction of the beam portion 110. The second-side end portion 114 extends from the other end of the fixed end portion 111 linearly along the extension direction. While the first-side end portion 113 and the second-side end portion 114 are parallel or substantially parallel to each other in the present preferred embodiment, it is also possible that the first-side end portion 113 and the second-side end portion 114 are not parallel or substantially parallel to each other.

Seen from the layering direction, an average of a dimension of a width W of the beam portion 110 in an orthogonal or substantially orthogonal direction to the extension direction of the beam portion 110 is greater than a maximal dimension of a length L thereof in the extension direction. The average of the dimension of the width W is calculated by dividing the area of the beam portion 110 as seen from the layering direction by the maximal dimension of the length L thereof in the extension direction.

Seen from the layering direction, a dimension of a width of the fixed end portion 111 in the orthogonal or substantially orthogonal direction is greater than the maximal dimension of the length L of the beam portion 110 in the extension direction. Seen from the layering direction, the dimension of the width of the fixed end portion 111 in the orthogonal or substantially orthogonal direction is, for example, about 90% or more of a dimension of a width of the free end portion 112 in the orthogonal or substantially orthogonal direction.

Specifically, as shown in FIG. 1, in the piezoelectric device 100 according to the first preferred embodiment of the present invention, the beam portion 110 has a rectangular or substantially rectangular outline with sides parallel or substantially parallel to the extension direction seen from the layering direction. That is, in the present preferred embodiment, the dimension of the width of the fixed end portion 111 in the orthogonal or substantially orthogonal direction, the dimension of the width of the free end portion 112 in the orthogonal or substantially orthogonal direction, and the average of the dimension of the width W of the beam portion 110 in the orthogonal or substantially orthogonal direction are the same or substantially the same as each other when seen from the layering direction.

Further, it is preferable in the present preferred embodiment that seen from the layering direction, the average of the dimension of the width W of the beam portion 110 in the orthogonal direction is, for example, about 3.25 times the maximal dimension of the length L of the beam portion 110 in the extension direction or smaller. That is, if the beam portion 110 has a rectangular or substantially rectangular outline with sides parallel or substantially orthogonal to the extension direction as seen from the layering direction, it is preferable that the dimension of the width W of the beam portion 110 in the orthogonal or substantially orthogonal direction is, for example, about 3.25 times the dimension of the length L of the beam portion 110 in the extension direction or smaller as seen from the layering direction. Herein, a ratio of the average of the dimension of the width W of the beam portion 110 in the orthogonal direction to the maximal dimension of the length L of the beam portion 110 in the extension direction as seen from the layering direction may be referred to just as an "aspect ratio". That is, in the present preferred embodiment, the aspect ratio is preferably, for example, about 3.25 times or smaller. A reason why the aspect ratio is preferably about 3.25 times or smaller will be discussed later.

Figure 4:
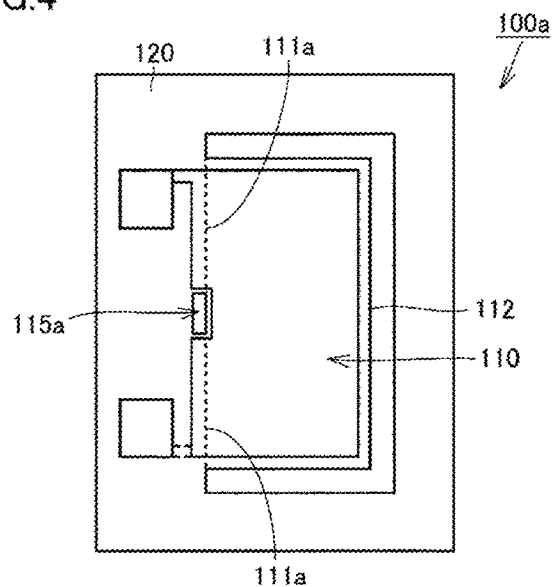
FIG. 4 is a plan view showing a piezoelectric device according to a modification of the first preferred embodiment of the present invention.

The beam portion 110 may also include multiple fixed end portions 111 as the fixed end portion 111. FIG. 4 is a plan view showing a piezoelectric device according to a modification of the first preferred embodiment of the present invention. As shown in FIG. 4, a piezoelectric device 100a according to a modification of the first preferred embodiment of the present invention includes multiple fixed end portions 111a located separately from each other in the orthogonal or substantially orthogonal direction. Specifically, the piezoelectric device 100a includes two fixed end portions 111a. Between the multiple fixed end portions 111a separated from each other, there is a through-hole 115a provided in the layering direction and the beam portion 110 and the base 120 are not connected to each other.

In this modification, the dimension of the width of the fixed end portions 111a in the orthogonal or substantially orthogonal direction as seen from the layering direction is a sum of the dimensions of the widths of the respective fixed end portions 111a in the orthogonal or substantially orthogonal direction. In this modification, seen from the layering direction, the sum of the dimensions of the widths of the respective fixed end portions 111a is, for example, about 90% or more of the dimension of the width of the free end portion 112 in the orthogonal direction.

As shown in FIGS. 1 to 3, in the piezoelectric device 100 according to the first preferred embodiment of the present invention, the maximal dimension of the length L of the beam portion 110 in the extension direction is preferably, for example, at least about five times or more of the dimension of a thickness of the beam portion 110 in the layering direction from a viewpoint of facilitating flexural vibration. That is, the piezoelectric device 100 shown in FIGS. 2 and 3 is schematically shown in terms of the dimension of the thickness of the multilayer body 10 in the layering direction.

As shown in FIGS. 1 to 3, the multilayer body 10 of the beam portion 110 includes a piezoelectric layer 11, a first electrode layer 12, and a second electrode layer 13.

The piezoelectric layer 11 is made of, for example, a monocrystal material. A cut orientation for the piezoelectric layer 11 is appropriately chosen so that desired device characteristics are obtained. In the present preferred embodiment, the piezoelectric layer 11 is a thinned monocrystal substrate and the monocrystal substrate is specifically a rotated Y-cut substrate. The cut orientation for the rotated Y-cut substrate is specifically about 30°, for example. A thickness of the piezoelectric layer 11 is about 0.3 μm or greater to about 5.0 μm or smaller, for example.

The material of the piezoelectric layer 11 is appropriately chosen so that the piezoelectric device 100 exhibits desired device characteristics. In the present preferred embodiment, the piezoelectric layer 11 is made of, for example, an inorganic material. Specifically, the piezoelectric layer 11 is made of, for example, an alkali niobate compound or an alkali tantalate compound. In the present preferred embodiment, for example, an alkali metal included in the alkali niobate compound or the alkali tantalate compound includes at least one of lithium, sodium, and potassium. In the present preferred embodiment, the piezoelectric layer 11 is made of lithium niobate ($LiNbO_3$) or lithium tantalate ($LiTaO_3$), for example.

Since the piezoelectric layer 11 in the present preferred embodiment is made of, for example, a monocrystal material, a thermal expansion coefficient of the piezoelectric layer 11 has anisotropy in an in-plane direction of a plane orthogonal or substantially orthogonal to the layering direction. The thermal expansion coefficient of the piezoelectric layer 11 in the extension direction is smaller than the thermal expansion coefficient of the piezoelectric layer 11 in a direction that is within the in-plane direction and is orthogonal or substantially orthogonal to the extension direction.

Figure 5:
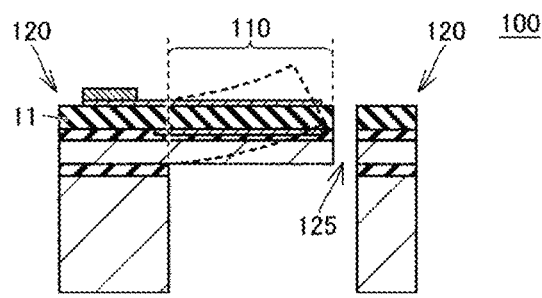
FIG. 5 is a sectional view showing a state of a beam portion with dotted lines in which the beam portion is warped in the piezoelectric device according to the first preferred embodiment of the present invention.

FIG. 5 is a sectional view showing a state of a beam portion with dotted lines in which the beam portion is warped in the piezoelectric device according to the first preferred embodiment of the present invention. As shown in FIG. 5, if the beam portion 110 becomes warped, the width of a clearance 125 between the beam portion 110 and the base 120 in the extension direction widens. In the present preferred embodiment, with the thermal expansion coefficient of the piezoelectric layer 11 in the in-plane direction being designed as described above, the beam portion 110 can be prevented from deforming to become warped when a temperature of the piezoelectric device 100 has increased. This can keep the width of the clearance 125 from widening and improve the device characteristics. Specifically, when the piezoelectric device 100 is used as a piezoelectric transducer, ultrasonic waves with stable sound pressure can be transmitted and reception sensitivity for ultrasonic waves can be stabilized over a relatively wide temperature range.

As shown in FIGS. 2 and 3, the first electrode layer 12 is positioned on one side of the piezoelectric layer 11. The second electrode layer 13 is opposed to at least a portion of the first electrode layer 12 across the piezoelectric layer 11 in the beam portion 110. In the present preferred embodiment, an adhesion layer, not shown, is positioned between the first electrode layer 12 and the piezoelectric layer 11 and between the second electrode layer 13 and the piezoelectric layer 11.

As shown in FIGS. 1 to 3, for an opposing region in which the first electrode layer 12 is opposed to the second electrode layer 13 in the beam portion 110, an average of a dimension of the width in the orthogonal or substantially orthogonal direction to the extension direction of the beam portion 110 is greater than the dimension of the length in the extension direction.

Seen from the layering direction, the area of the opposing region, in which the first electrode layer 12 is opposed to the second electrode layer 13 in the beam portion 110, is preferably as large as possible within the range of smaller than or equal to the area of the beam portion 110. This is because the larger the area of the opposing region, a value of an electromechanical coupling coefficient of the piezoelectric device 100 can be made higher to improve the device characteristics of the piezoelectric device 100. In the present preferred embodiment, seen from the layering direction, the area of the opposing region in which the first electrode layer 12 is opposed to the second electrode layer 13 in the beam portion 110 is, about 90% or more of the area of the beam portion 110.

Seen from the layering direction, the area of the opposing region in which the first electrode layer 12 is opposed to the second electrode layer 13 in the beam portion 110 is, for example, about 90% or more of the lesser of the area of the first electrode layer 12 and the area of the second electrode layer 13 in the beam portion 110. More specifically, seen from the layering direction, the area of the opposing region in which the first electrode layer 12 is opposed to the second electrode layer 13 in the beam portion 110 is, for example, about 90% or more of the area of the first electrode layer 12 and about 90% or more of the area of the second electrode layer 13.

In the present preferred embodiment, the first electrode layer 12 and the second electrode layer 13 are each made of Pt, for example. Each of the first electrode layer 12 and the second electrode layer 13 may also be made of other material, such as Al, for example. The adhesion layer is made of Ti, for example. The adhesion layer may also be made of other material, such as NiCr, for example. Each of the first electrode layer 12, the second electrode layer 13, and the adhesion layer may be, for example, an epitaxially grown membrane. If the piezoelectric layer 11 is made of lithium niobate ($LiNbO_3$), it is preferable that the adhesion layer is made of NiCr, for example, from a viewpoint of suppressing diffusion of the material forming the adhesion layer into the first electrode layer 12 or the second electrode layer 13. This improves the reliability of the piezoelectric device 100.

In the present preferred embodiment, the thickness of each of the first electrode layer 12 and the second electrode layer 13 is about 0.05 µm or greater to about 0.2 µm or smaller, for example. The thickness of the adhesion layer is about 0.005 µm or greater to about 0.05 µm or smaller, for example.

The multilayer body 10 further includes a supporting layer 14. The supporting layer 14 is positioned on the second electrode layer 13 side of the piezoelectric layer 11 and on the opposite side of the second electrode layer 13 to the piezoelectric layer 11 side. The supporting layer 14 includes a first supporting layer 14a, and a second supporting layer 14b on the first supporting layer 14a at the opposite side to the piezoelectric layer 11 side. In the present preferred embodiment, for example, the first supporting layer 14a is made of $SiO_2$ and the second supporting layer 14b is made of monocrystalline Si. In the present preferred embodiment, the thickness of the supporting layer 14 is preferably greater than the piezoelectric layer 11 from a viewpoint of flexural vibration of the beam portion 110. The mechanism of flexural vibration of the beam portion 110 will be described later.

The base 120 is connected with the fixed end portion 111 of the beam portion 110. Seen from the layering direction of the multilayer body 10, the base 120 surrounds the beam portion 110 while providing the clearance 125 at an interval from the beam portion 110 except for the fixed end portion 111. The base 120 is annular as seen from the layering direction.

As the width of the clearance 125 between the base 120 and the beam portion 110 becomes narrower, the device characteristics of the piezoelectric device 100 become better. For example, when the piezoelectric device 100 is used as an ultrasonic transducer, as the width of the clearance 125 becomes narrower, escaping of a force provided by the beam portion 110 to medium lying around the beam portion 110 or a force received by the beam portion 110 from the medium through the clearance 125 can be further reduced or prevented. A slit width of the clearance 125 is preferably about 10 µm or less, for example, and more preferably about 1 µm or less.

As shown in FIGS. 2 and 3, the multilayer body 10 defines at least a portion of the base 120 continuously from the beam portion 110. The base 120 in turn includes a first connection electrode 121 and a second connection electrode 122. The first connection electrode 121 is electrically connected to the first electrode layer 12 via the adhesion layer, not shown, while being exposed to the outside. Specifically, the first connection electrode 121 is positioned in the base 120 on the first electrode layer 12 at the opposite side to the piezoelectric layer 11 side.

The second connection electrode 122 is electrically connected to the second electrode layer 13 via the adhesion layer, not shown, while being exposed to the outside. Specifically, the second connection electrode 122 is positioned in the base 120 on the second electrode layer 13 at the opposite side to the supporting layer 14 side.

The thickness of each of the first connection electrode 121 and the second connection electrode 122 is about 0.1 µm or greater to about 1.0 µm or smaller, for example. The thickness of each of the adhesion layer connected with the first connection electrode 121 and the adhesion layer connected with the second connection electrode 122 is about 0.005 µm or greater to about 0.1 µm or smaller, for example.

In the present preferred embodiment, the first connection electrode 121 and the second connection electrode 122 are made of Au, for example. The first connection electrode 121 and the second connection electrode 122 may also be made of other conductive material, such as Al, for example. Each of the adhesion layer connected with the first connection electrode 121 and the adhesion layer connected with the second connection electrode 122 is made of Ti, for example. These adhesion layers may also be made of NiCr, for example.

The first connection electrode 121 and the second connection electrode 122 are located in the base 120 on the fixed end portion 111 side with respect to the beam portion 110 as seen from the layering direction. The length, in the extension direction, of a portion of the base 120 that is located on the free end portion 112 side with respect to the beam portion 110 is shorter than the length, in the extension direction, of a portion that is located on the fixed end portion 111 side with respect to the beam portion 110.

The base supporting portion 130 is connected to one side of the base 120. The base supporting portion 130 is specifically positioned below the base 120. The base supporting portion 130 includes a first base supporting portion 131 and a second base supporting portion 132 on the first base supporting portion 131 at the opposite side to the base 120 side. The first base supporting portion 131 is made of $SiO_2$, and the second base supporting portion 132 is made of monocrystalline Si, for example.

The base supporting portion 130 has an annular outline along the base 120 as seen from the layering direction. The cavity 140 is open to the opposite side to the beam portion 110 side by being surrounded by the beam portion 110 and the base supporting portion 130.

Figure 6:
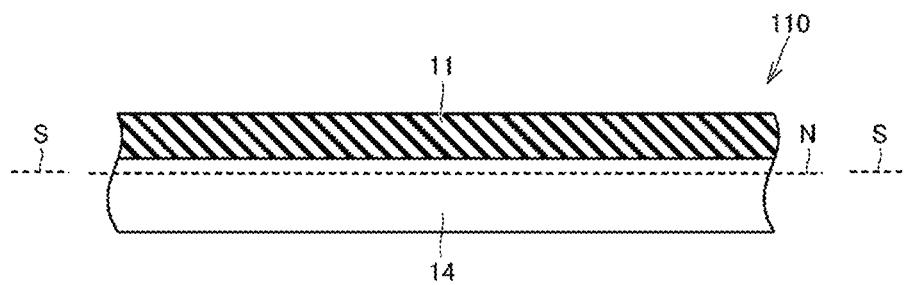
FIG. 6 is a sectional view schematically showing a portion of the beam portion of the piezoelectric device according to the first preferred embodiment of the present invention.
Figure 7:
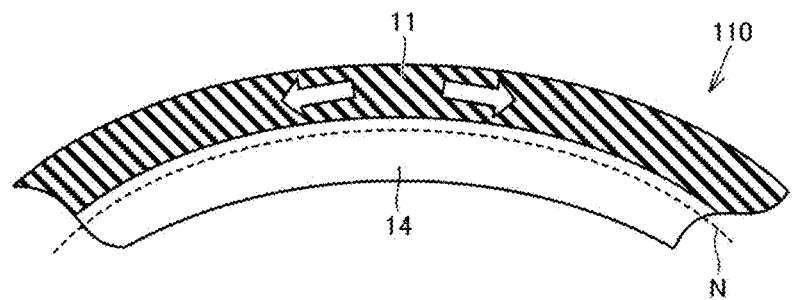
FIG. 7 is a sectional view schematically showing a portion of the beam portion upon driving of the piezoelectric device according to the first preferred embodiment of the present invention.

Here, the mechanism by which the beam portion 110 vibrates in the piezoelectric device 100 according to the first preferred embodiment of the present invention is described. FIG. 6 is a sectional view schematically showing a portion of the beam portion of the piezoelectric device according to the first preferred embodiment of the present invention. FIG. 7 is a sectional view schematically showing a portion of the beam portion upon driving of the piezoelectric device according to the first preferred embodiment of the present invention. In FIGS. 6 and 7, the first electrode layer 12 and the second electrode layer 13 are not shown.

As shown in FIGS. 6 and 7, in the present preferred embodiment, the piezoelectric layer 11 defines and functions as an expanding/contracting layer that can expand and contract in the in-plane direction of a plane S and the other layers except the piezoelectric layer 11 define and function as a constraining layer in the beam portion 110. In the present preferred embodiment, primarily the supporting layer 14 defines and functions as the constraining layer. The constraining layer is thus layered in an orthogonal or substantially orthogonal direction to an expanding/contracting direction of the expanding/contracting layer with respect to the expanding/contracting layer. The beam portion 110 may include a reverse expanding/contracting layer that can contract in the in-plane direction when the expanding/contracting layer expands in the in-plane direction and expand in the in-plane direction when the expanding/contracting layer contracts in the in-plane direction, in place of the constraining layer.

Then, when the piezoelectric layer 11 as the expanding/contracting layer is to expand and contract in the in-plane direction, the supporting layer 14 as a major portion of the constraining layer constrains the expansion and contraction of the piezoelectric layer 11 in an interface with the piezoelectric layer 11. In the present preferred embodiment, in the beam portion 110, the piezoelectric layer 11 as the expanding/contracting layer is positioned only on one side of a stress neutral plane N of the beam portion 110. The position of a center of gravity of the supporting layer 14, which is a major component of the constraining layer, is located on the other side of the stress neutral plane N. As a result, when the piezoelectric layer 11 as the expanding/contracting layer expands and contracts in the in-plane direction of the plane S, the beam portion 110 bends in the orthogonal or substantially orthogonal direction to the plane S as shown in FIGS. 6 and 7. An amount of displacement of the beam portion 110 upon bending of the beam portion 110 becomes greater as a separation distance between the stress neutral plane N and the piezoelectric layer 11 is longer. The amount of displacement also becomes greater as the stress with which the piezoelectric layer 11 acts to expand and contract is greater. In this manner, the beam portion 110 flexurally vibrates in the orthogonal or substantially orthogonal direction to the plane S with the fixed end portion 111 as origin, shown in FIGS. 1 to 3.

Figure 8:
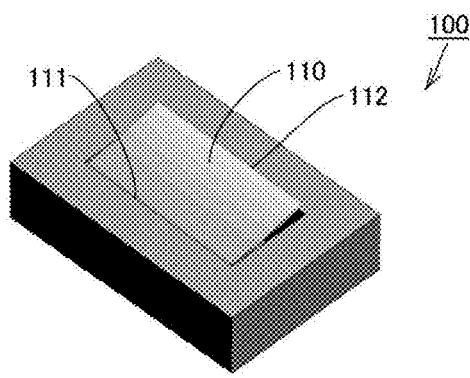
FIG. 8 is a perspective view showing a state of vibrating in fundamental vibration mode by simulation for the piezoelectric device according to the first preferred embodiment of the present invention.

Furthermore, as shown in FIG. 1, the piezoelectric device 100 according to the present preferred embodiment includes a single beam portion 110. Accordingly, there is no reduction in the device characteristics which is caused by vibration of multiple cantilever beam portions with different phases from each other in a piezoelectric device having multiple cantilever beam portions disposed adjacent to each other. FIG. 8 is a perspective view showing a state of vibrating in fundamental vibration mode by simulation for the piezoelectric device according to the first preferred embodiment of the present invention. In FIG. 8, the piezoelectric device 100 is illustrated with some members omitted. FIG. 8 also shows the piezoelectric device 100 with the beam portion 110 being displaced to the first electrode layer 12 side, shown in FIG. 1. As shown in FIG. 8, the color is paler as the amount of displacement of the beam portion 110 to the first electrode layer 12 side is greater. Details of fundamental vibration mode will be discussed later.

The piezoelectric device 100 according to the present preferred embodiment has improved device characteristics when used as an ultrasonic transducer in particular. In the following, functions of the piezoelectric device 100 when the piezoelectric device 100 according to the present preferred embodiment is used as an ultrasonic transducer will be described.

Initially, as shown in FIG. 1, when an ultrasonic wave is to be generated with the piezoelectric device 100, a voltage is applied between the first connection electrode 121 and the second connection electrode 122. Then, as shown in FIGS. 2 and 3, a voltage is applied between the first electrode layer 12 connected with the first connection electrode 121 and the second electrode layer 13 connected with the second connection electrode 122. Consequently, in the beam portion 110, a voltage is also applied between the first electrode layer 12 and the second electrode layer 13, which lie opposite each other across the piezoelectric layer 11. This causes the piezoelectric layer 11 to expand and contract in the in-plane direction of the plane S, so that the beam portion 110 flexurally vibrates in the orthogonal direction to the plane S due to the mechanism described above. This causes force to be applied to the medium around the piezoelectric device 100 and further the medium vibrates to generate an ultrasonic wave.

In the piezoelectric device 100 according to the present preferred embodiment, the beam portion 110 has a specific mechanical resonant frequency. Thus, if the voltage applied is a sinusoidal voltage and the frequency of the sinusoidal voltage is close to the value of the resonant frequency, the amount of displacement upon bending of the beam portion 110 will be large.

In detection of an ultrasonic wave by the piezoelectric device 100, an ultrasonic wave causes the medium around the beam portion 110 to vibrate and a force is applied to the beam portion 110 from the medium around the beam portion 110 to make the beam portion 110 flexurally vibrate. When the beam portion 110 flexurally vibrates, a stress is applied to the piezoelectric layer 11. The application of the stress to the piezoelectric layer 11 induces an electric charge in the piezoelectric layer 11. The electric charge induced in the piezoelectric layer 11 produces a potential difference between the first electrode layer 12 and the second electrode layer 13 lying opposite each other across the piezoelectric layer 11. This potential difference is detected with the first connection electrode 121 connected to the first electrode layer 12 and the second connection electrode 122 connected to the second electrode layer 13. Thus, an ultrasonic wave can be detected in the piezoelectric device 100.

When the ultrasonic wave to be detected includes a specific frequency component in a large proportion and if that frequency component is close to the value of the resonant frequency, the amount of displacement in flexural vibration of the beam portion 110 is larger. The larger amount of displacement results in an increase in the potential difference.

As described, when the piezoelectric device 100 according to the present preferred embodiment is used as an ultrasonic transducer, a combination of the frequency of the sinusoidal voltage applied and the resonant frequency of the beam portion 110 is important. Then, while in the piezoelectric device 100 a varying maximal dimension of the length L of the beam portion 110 in the extension direction leads to a change in the resonant frequency of the beam portion 110, the beam portion 110 in the present preferred embodiment is designed so that seen from the layering direction, the average of the dimension of the width W of the beam portion 110 in the orthogonal direction to the extension direction is greater than the maximal dimension of the length L thereof in the extension direction. Thus, the area of the beam portion 110 can be increased to improve the device characteristics of the piezoelectric device 100 by designing the resonant frequency of the beam portion 110 to be in the vicinity of the frequency of the sinusoidal voltage with setting of the maximal dimension of the length L in the extension direction to a predetermined length, while making the average of the dimension of the width W greater than the maximal dimension of length L in the extension direction. That is, for the piezoelectric device 100, the device characteristics can be improved while reducing or preventing changes in the resonant frequency of the beam portion 110.

A sinusoidal voltage for driving the piezoelectric device 100 in the case of using the piezoelectric device 100 according to the present preferred embodiment as an ultrasonic transducer is further described.

An ultrasonic transducer is driven using a tone burst signal in the case where the piezoelectric device 100 is used as an ultrasonic transducer to transmit an ultrasonic wave and further receive a reflected ultrasonic wave resulting from reflection of the transmitted ultrasonic wave on a component different from the piezoelectric device 100. The tone burst signal is provided by a sinusoidal voltage. The tone burst signal is a signal that applies the sinusoidal voltage successively only for a certain wave number. The wave number of the sinusoidal voltage is appropriately adjusted via a Q value of resonance of the beam portion 110. For the tone burst signal, a sinusoidal voltage with a wave number of around 20 waves is often used.

Figure 9:
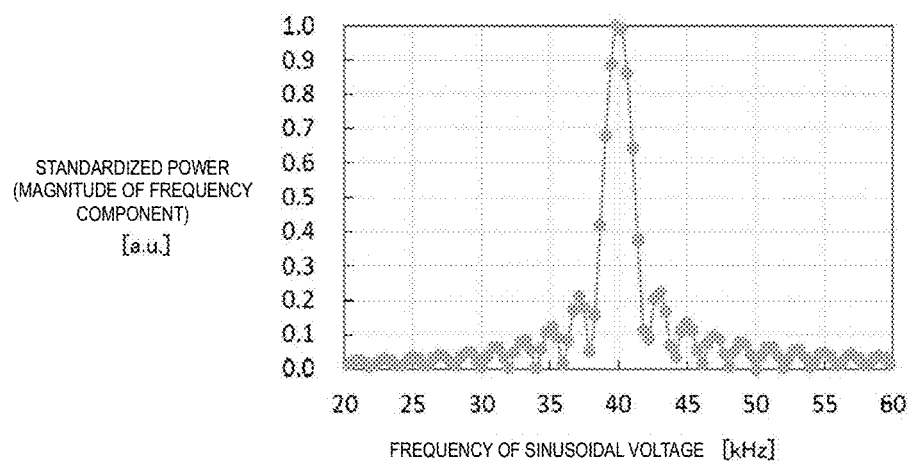
FIG. 9 is a graph showing an example of power spectrum of a sinusoidal voltage applied to the piezoelectric device according to the first preferred embodiment of the present invention.

FIG. 9 is a graph showing an example of power spectrum of a sinusoidal voltage applied to the piezoelectric device according to the first preferred embodiment of the present invention. As shown in FIG. 9, the sinusoidal voltage includes multiple consecutive frequency components. The sinusoidal voltage also includes a center frequency as the highest frequency component. A frequency component of a sinusoidal voltage tends to be smaller as the difference between the frequency of that frequency component and the center frequency becomes larger. For the sinusoidal voltage shown in FIG. 9, the center frequency is about 40 kHz. For the sinusoidal voltage, a frequency with a larger difference from about 40 kHz has a smaller frequency component. For example, the magnitudes of frequency components in the neighborhood of about 30 kHz and in the neighborhood of about 50 kHz, having a difference of about 10 kHz from about 40 kHz, are each about one tenth of the magnitude of the approximately 40-kHz frequency component.

Next, the resonant frequency of the beam portion 110 is further described. The beam portion 110 of the piezoelectric device 100 also has multiple resonant frequencies as mechanical resonant frequencies. The beam portion 110 vibrates in the fundamental vibration mode when it vibrates only at the resonant frequency with the highest frequency component. When the beam portion 110 vibrates in the fundamental vibration mode, the free end portion 112 is similarly displaced in the layering direction over the orthogonal or substantially orthogonal direction as shown in FIG. 8.

Figure 10:
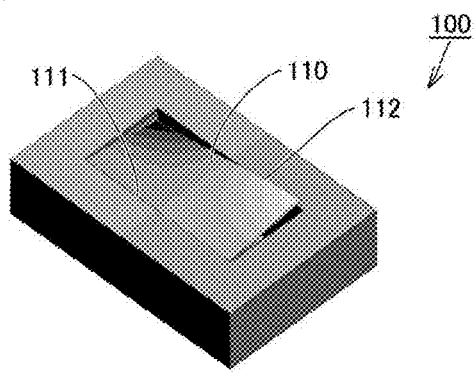
FIG. 10 is a perspective view showing a state of vibrating in unwanted mode by simulation for the piezoelectric device according to the first preferred embodiment of the present invention.

Here, in the present preferred embodiment, the beam portion 110 can vibrate in an unwanted mode. FIG. 10 is a perspective view showing a state of vibrating in the unwanted mode by simulation for the piezoelectric device according to the first preferred embodiment of the present invention. As shown in FIG. 10, when the beam portion 110 vibrates in the unwanted mode only, one end of the free end portion 112 in the orthogonal or substantially orthogonal direction and the other end are displaced in different directions from each other. The mechanical resonant frequency of the beam portion 110 when vibrating in the unwanted mode is different from the resonant frequency in the fundamental vibration mode.

Thus, since the sinusoidal voltage has multiple frequency components in the piezoelectric device 100 according to the present preferred embodiment, when the piezoelectric device 100 is driven with the sinusoidal voltage, the beam portion 110 is excited by frequency components including frequencies in the neighborhood of the resonant frequency of the fundamental vibration mode as well as frequency components including frequencies in the neighborhood of the resonant frequency of the unwanted mode. As a result, the beam portion 110 vibrates in a mode in which vibration in the fundamental vibration mode and vibration in the unwanted mode can potentially cause deterioration in the device characteristics of the piezoelectric device 100.

It is therefore preferable that the fundamental vibration mode is predominant over vibration in the unwanted mode for the vibration of the beam portion 110. In the present preferred embodiment, from a viewpoint of making the fundamental vibration mode predominant over vibration in the unwanted mode, it is preferable to design the piezoelectric device 100 such that the resonant frequency of the fundamental vibration mode of the piezoelectric device 100 is the same as or similar to the center frequency of the sinusoidal voltage. This is because the frequency component of the center frequency of the sinusoidal voltage is higher than the frequency components of the other frequencies as discussed above.

Also as described above, the frequency component of the frequency of a sinusoidal voltage is smaller as the difference between that frequency and the center frequency becomes larger. Thus, if the piezoelectric device 100 is designed such that the resonant frequency of the fundamental vibration mode of the piezoelectric device 100 is the same as or similar to the center frequency of the sinusoidal voltage, it is further preferable to design the piezoelectric device 100 so that an absolute value of the difference between the resonant frequency of the unwanted mode of the piezoelectric device 100 and the resonant frequency of the fundamental vibration mode is large. This is because such a design can make frequency components of frequencies of the sinusoidal voltage in the neighborhood of the resonant frequency of the unwanted mode relatively smaller with respect to the frequency component of the center frequency.

In the following, the piezoelectric device 100 according to the first preferred embodiment of the present invention will be further described with respect to piezoelectric devices according to a number of examples with mutually different aspect ratios of the beam portion 110, in relation to an experimental example where the absolute value of the difference between the resonant frequency of the fundamental vibration mode and the resonant frequency of the unwanted mode is calculated through a simulation.

In this experimental example, the piezoelectric devices according to the respective examples were designed such that the resonant frequency of the fundamental vibration mode was about 40 kHz. Specifically, for each example, the aspect ratio was adjusted by varying the width of the beam portion in the orthogonal direction to the extension direction within a range of about 800 μm to about 1600 μm, with lithium niobate being a material of the piezoelectric layer, the thickness of the piezoelectric layer being about 1 μm, the thickness of each of the first electrode layer and the second electrode layer being about 0.1 μm, the thickness of the first supporting layer being about 0.8 μm, the thickness of the second supporting layer being about 3.8 μm, and the length of the beam portion in the extension direction being about 400 μm.

Figure 11:
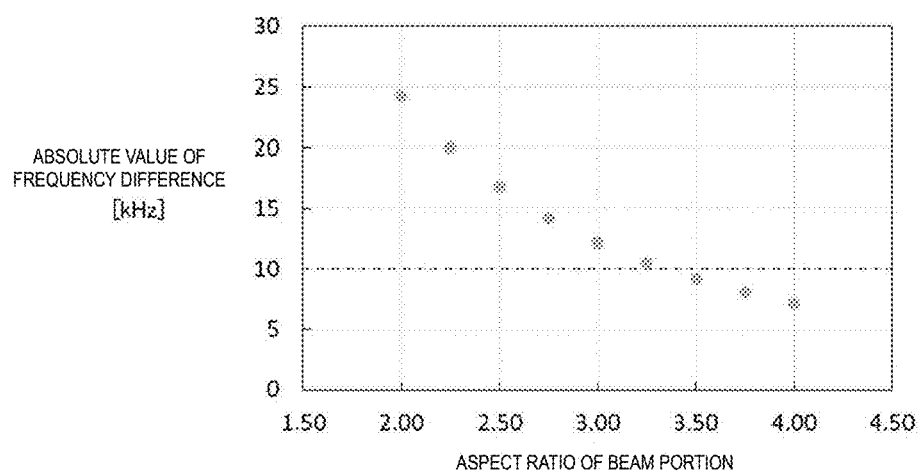
FIG. 11 is a graph showing absolute values of the difference between the resonant frequency of the fundamental vibration mode and the resonant frequency of the unwanted mode versus values of an aspect ratio of the beam portion, for the piezoelectric device according to the first preferred embodiment of the present invention.

FIG. 11 is a graph showing absolute values of the difference between the resonant frequency of the fundamental vibration mode and the resonant frequency of the unwanted mode versus values of an aspect ratio of the beam portion, for the piezoelectric device according to the first preferred embodiment of the present invention. As shown in FIG. 11, the smaller the value of the aspect ratio of the beam portion, the larger the absolute value of the difference between the resonant frequency of the fundamental vibration mode and the resonant frequency of the unwanted mode. Then, it can be seen that if the value of the aspect ratio of the beam portion is about 3.25 times or less, the absolute value of the difference between the resonant frequency of the fundamental vibration mode and the resonant frequency of the unwanted mode can be greater than about 10 kHz.

That is, if a sinusoidal voltage with a center frequency of about 40 kHz as discussed above is applied to a piezoelectric device for which the value of the aspect ratio of the beam portion is about 3.25 times or less, the frequency components of frequencies of the sinusoidal voltage of about 40±10 kHz are one tenth or less of the frequency component of the center frequency about 40 kHz. Thus, it can be seen that the influence of vibration in the unwanted mode in the vibration of the beam portion can be made sufficiently small.

Figure 12:
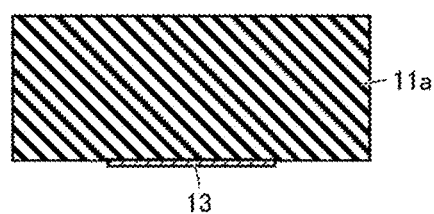
FIG. 12 is a sectional view showing a state in which a second electrode layer has been provided on a piezoelectric monocrystal substrate in a method of manufacturing the piezoelectric device according to the first preferred embodiment of the present invention.

In the following, a non-limiting example of a method of manufacturing the piezoelectric device according to the first preferred embodiment of the present invention is described. FIG. 12 is a sectional view showing a state in which a second electrode layer has been provided on a piezoelectric monocrystal substrate in a method of manufacturing the piezoelectric device according to the first preferred embodiment. FIG. 12 and FIGS. 13 to 17 and 19 are illustrated in sectional view as with FIG. 2.

As shown in FIG. 12, an adhesion layer, not shown, is first provided on an undersurface of a piezoelectric monocrystal substrate 11a, and then the second electrode layer 13 is provided on the adhesion layer at the opposite side to the piezoelectric monocrystal substrate 11a side. The second electrode layer 13 is formed so as to have a desired pattern by, for example, deposition lift-off. The second electrode layer 13 may also be formed by, for example, layering it over the entire or substantially the entire undersurface of the piezoelectric monocrystal substrate 11a by sputtering and then forming a desired pattern by etching. The second electrode layer 13 and the adhesion layer may also be epitaxially grown.

Figure 13:
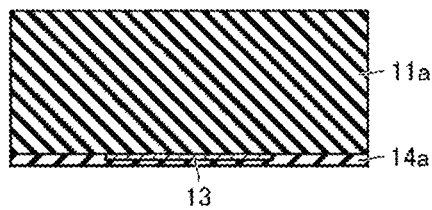
FIG. 13 is a sectional view showing a state in which a first supporting layer has been provided in the method of manufacturing the piezoelectric device according to the first preferred embodiment of the present invention.

FIG. 13 is a sectional view showing a state in which a first supporting layer has been provided in the method of manufacturing the piezoelectric device according to the first preferred embodiment of the present invention. As shown in FIG. 13, the first supporting layer 14a is provided on the respective undersurfaces of the piezoelectric monocrystal substrate 11a and the second electrode layer 13 by chemical vapor deposition (CVD) or physical vapor deposition (PVD), for example. Immediately after the first supporting layer 14a is provided, there is a bulge in a portion of the undersurface of the first supporting layer 14a that is located on the first supporting layer 14a at the opposite side to the second electrode layer 13 side. Thus, the undersurface of the first supporting layer 14a is shaved and flattened such as, for example, by chemical mechanical polishing (CMP).

Figure 14:
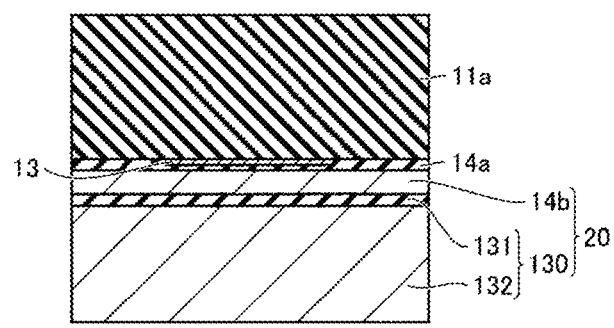
FIG. 14 is a sectional view showing a state in which a laminate substrate has been bonded to the first supporting layer in the method of manufacturing the piezoelectric device according to the first preferred embodiment of the present invention.

FIG. 14 is a sectional view showing a state in which a laminate substrate has been bonded to the first supporting layer in the method of manufacturing the piezoelectric device according to the first preferred embodiment of the present invention. As shown in FIG. 14, a laminate substrate 20, including the second supporting layer 14b and the base supporting portion 130, is bonded to the undersurface of the first supporting layer 14a by surface activated bonding or atomic diffusion bonding. In the present preferred embodiment, the laminate substrate 20 is, for example, a silicon on insulator (SOI) substrate. Yields of the piezoelectric device 100 are improved by previously flattening a top surface of the second supporting layer 14b by, for example, CMP prior to bonding of the laminate substrate 20.

Figure 15:
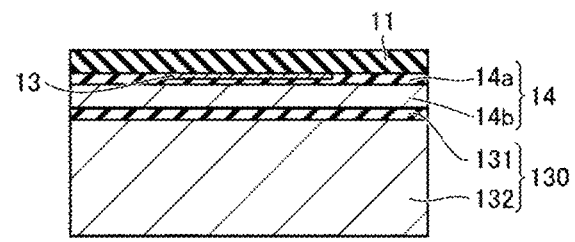
FIG. 15 is a sectional view showing a state in which a piezoelectric layer has been formed by shaving the piezoelectric monocrystal substrate in the method of manufacturing the piezoelectric device according to the first preferred embodiment of the present invention.

FIG. 15 is a sectional view showing a state in which a piezoelectric layer has been formed by shaving the piezoelectric monocrystal substrate in the method of manufacturing the piezoelectric device according to the first preferred embodiment of the present invention. As shown in FIGS. 14 and 15, a top surface of the piezoelectric monocrystal substrate 11a is thinned by, for example, grinding with a grinder. By further polishing the thinned top surface of the piezoelectric monocrystal substrate 11a such as by, for example, CMP, the piezoelectric monocrystal substrate 11a is shaped into the piezoelectric layer 11.

The piezoelectric monocrystal substrate 11a may also be shaped into the piezoelectric layer 11 by, for example, injecting ions on the top side of the piezoelectric monocrystal substrate 11a beforehand to form a peeling layer and stripping the peeling layer. The piezoelectric monocrystal substrate 11a may also be shaped into the piezoelectric layer 11 by, for example, further polishing the top surface of the piezoelectric monocrystal substrate 11a after stripping of the peeling layer such as by CMP.

Figure 16:
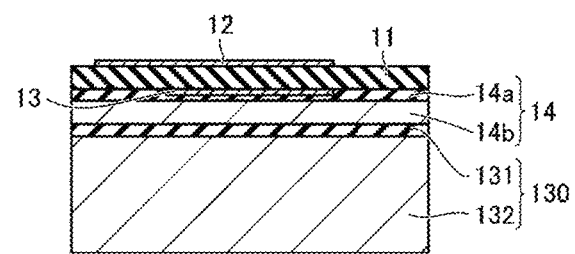
FIG. 16 is a sectional view showing a state in which a first electrode layer has been provided on the piezoelectric layer in the method of manufacturing the piezoelectric device according to the first preferred embodiment of the present invention.

FIG. 16 is a sectional view showing a state in which a first electrode layer has been provided on the piezoelectric layer in the method of manufacturing the piezoelectric device according to the first preferred embodiment of the present invention. As shown in FIG. 16, after an adhesion layer, not shown, is provided on the top surface of the piezoelectric layer 11, the first electrode layer 12 is provided on the adhesion layer at the opposite side to the piezoelectric layer 11 side. The first electrode layer 12 is formed so as to have a desired pattern by, for example, deposition lift-off. The first electrode layer 12 may also be formed by, for example, layering it over the entire or substantially the entire top surface of the piezoelectric layer 11 by sputtering and then forming a desired pattern by etching. The first electrode layer 12 and the adhesion layer may also be epitaxially grown, for example.

Figure 17:
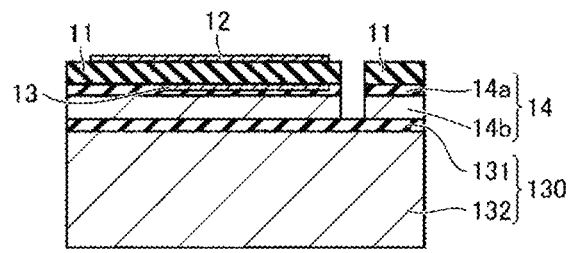
FIG. 17 is a sectional view showing a state in which a slit has been formed through to a top surface of a first base supporting portion from the opposite side of the piezoelectric layer to the supporting layer side in the method of manufacturing the piezoelectric device according to the first preferred embodiment of the present invention.
Figure 18:
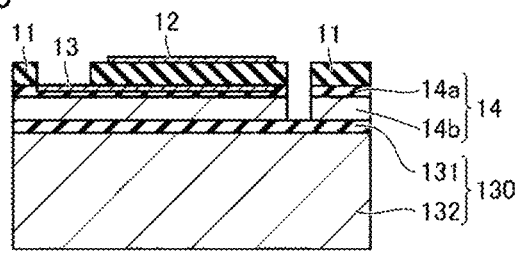
FIG. 18 is a sectional view showing a state in which a through-hole has been formed through to a top surface of a second electrode layer from the opposite side of the piezoelectric layer to the supporting layer side in the method of manufacturing the piezoelectric device according to the first preferred embodiment of the present invention.
Figure 20:
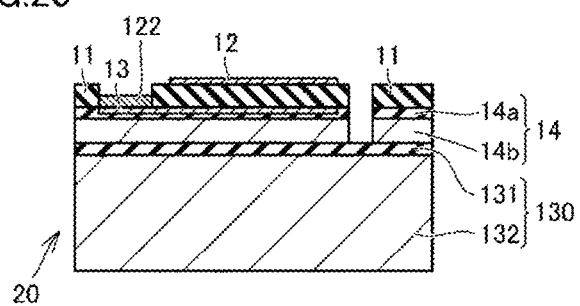
FIG. 20 is a sectional view showing a state in which a second connection electrode has been provided on the second electrode layer in the method of manufacturing the piezoelectric device according to the first preferred embodiment of the present invention.

FIG. 17 is a sectional view showing a state in which a slit has been formed through to a top surface of a first base supporting portion from the opposite side of the piezoelectric layer to the supporting layer side in the method of manufacturing the piezoelectric device according to the first preferred embodiment of the present invention. FIG. 18 is a sectional view showing a state in which a through-hole has been formed through to a top surface of a second electrode layer from the opposite side of the piezoelectric layer to the supporting layer side in the method of manufacturing the piezoelectric device according to the first preferred embodiment of the present invention. FIG. 18 and FIG. 20 shown below are illustrated in sectional view as with FIG. 3.

As shown in FIG. 17, a slit is formed in the piezoelectric layer 11 and the first supporting layer 14a by, for example, dry etching with reactive ion etching (RIE). The slit may also be formed by, for example, wet etching with hydrofluoric-nitric acid and the like. Further, the second supporting layer 14b exposed into the slit is etched by, for example, deep reactive ion etching (DRIE) so that the slit reaches the top surface of the first base supporting portion 131. This results in the formation of the clearance 125 between the beam portion 110 and the base 120 in the piezoelectric device 100 as seen from the layering direction, as shown in FIG. 1. Additionally, as shown in FIG. 18, at a portion corresponding to the base 120 in the piezoelectric device 100 according to the present preferred embodiment, the piezoelectric layer 11 is etched so that a portion of the second electrode layer 13 is exposed by the dry etching or the wet etching.

Figure 19:
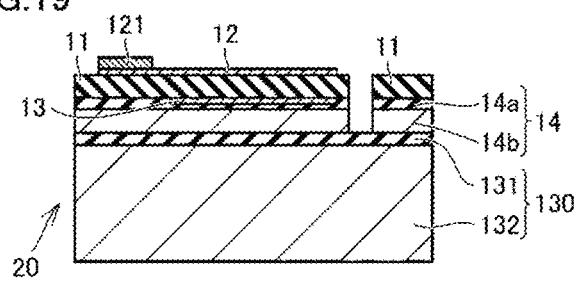
FIG. 19 is a sectional view showing a state in which a first connection electrode has been provided on the first electrode layer in the method of manufacturing the piezoelectric device according to the first preferred embodiment of the present invention.

FIG. 19 is a sectional view showing a state in which a first connection electrode has been provided on the first electrode layer in the method of manufacturing the piezoelectric device according to the first preferred embodiment of the present invention. FIG. 20 is a sectional view showing a state in which a second connection electrode has been provided on the second electrode layer in the method of manufacturing the piezoelectric device according to the first preferred embodiment of the present invention. As shown in FIGS. 19 and 20, at a portion corresponding to the base 120 in the piezoelectric device 100, after an adhesion layer, not shown, is provided on each of the first electrode layer and the second electrode layer 13, the first connection electrode 121 and the second connection electrode 122 are provided on the upper surfaces of the respective adhesion layers by, for example, deposition lift-off. The first connection electrode 121 and the second connection electrode 122 may be formed by, for example, layering them over the entire or substantially the entire surfaces of the piezoelectric layer 11, the first electrode layer 12, and the exposed second electrode layer 13 by sputtering, and then forming a desired pattern by etching.

Finally, a portion of the laminate substrate 20 is removed by, for example, DRIE as shown in FIGS. 2, 3, 19, and 20. This results in the formation of the multiple beam portions 110, the base 120, the base supporting portion 130, and the cavity 140 of the piezoelectric device 100 according to the present preferred embodiment. Through the steps described above, the piezoelectric device 100 according to the first preferred embodiment of the present invention as shown in FIGS. 1 to 3 is manufactured.

As described above, the piezoelectric device 100 according to the first preferred embodiment of the present invention includes the single beam portion 110 and the base 120. The beam portion 110 includes the fixed end portion 111 and the free end portion 112. The free end portion 112 is opposed to the fixed end portion 111. The beam portion 110 extends from the fixed end portion 111 toward the free end portion 112. The beam portion 110 includes a multilayer body 10. The multilayer body 10 includes the piezoelectric layer 11, the first electrode layer 12, and the second electrode layer 13. The first electrode layer 12 is positioned on one side of the piezoelectric layer 11. The second electrode layer 13 is opposed to at least a portion of the first electrode layer 12 across the piezoelectric layer 11. The base 120 is connected with the fixed end portion 111 of the beam portion 110. Seen from the layering direction of the multilayer body 10, the base 120 surrounds the beam portion 110 at an interval from the beam portion 110 except for the fixed end portion 111. The base 120 is annular. Seen from the layering direction, the average of the dimension of the width W of the beam portion 110 in the orthogonal or substantially orthogonal direction to the extension direction of the beam portion 110 is greater than the maximal dimension of the length L thereof in the extension direction.

This can improve the device characteristics while reducing or preventing changes in the resonant frequency of the beam portion 110.

In the present preferred embodiment, seen from the layering direction, the dimension of the width of the fixed end portion 111 in the orthogonal or substantially orthogonal direction is greater than the maximal dimension of the length L of the beam portion 110 in the extension direction.

As a result, the beam portion 110 is firmly connected at the fixed end portion 111, thus facilitating acting of internal stress in a direction against inertial force that acts on the free end portion 112 due to the vibration of the free end portion 112 when the beam portion 110 vibrates. It in turn can reduce or prevent a reduction of the resonant frequency of the beam portion 110 with respect to the resonant frequency which is theoretically calculated in designing the piezoelectric device 100.

In the present preferred embodiment, seen from the layering direction, the dimension of the width of the fixed end portion 111 in the orthogonal direction is, for example, about 90% or more of the dimension of the width of the free end portion 112 in the orthogonal or substantially orthogonal direction.

As a result, the beam portion 110 is firmly connected at the fixed end portion 111, thus facilitating acting of internal stress in a direction against inertial force that acts on the free end portion 112 due to the vibration of the free end portion 112 when the beam portion 110 vibrates. It in turn can reduce or prevent a reduction of the resonant frequency of the beam portion 110 with respect to the resonant frequency which is theoretically calculated in designing the piezoelectric device 100.

In the present preferred embodiment, seen from the layering direction, the beam portion 110 has a rectangular or substantially rectangular outline with sides parallel or substantially parallel to the extension direction. This allows the piezoelectric device 100 to have a simplified configuration.

In the present preferred embodiment, it is preferable that seen from the layering direction, the average of the dimension of the width W of the beam portion 110 in the orthogonal direction is, for example, about 3.25 times the maximal dimension of the length L of the beam portion 110 in the extension direction or smaller.

By making the average of the dimension of width W of the beam portion 110 in the orthogonal or substantially orthogonal direction about 3.25 times the maximal dimension of the length L of the beam portion 110 in the extension direction or smaller, the absolute value of the difference between the resonant frequency of the beam portion 110 in the fundamental vibration mode and the resonant frequency in the unwanted mode can be made large, while reducing or preventing changes in the resonant frequency of the beam portion 110. Thus, when a sinusoidal voltage with multiple frequency components is applied to the piezoelectric device 100, components of the unwanted vibration mode of the vibration modes of the beam portion 110 becomes relatively small with respect to the component of the fundamental vibration mode. As a result, the device characteristics of the piezoelectric device 100 can be improved.

In the present preferred embodiment, for the opposing region in which the first electrode layer 12 is opposite the second electrode layer 13 in the beam portion 110, the average of the dimension of the width in the orthogonal or substantially orthogonal direction to the extension direction of the beam portion 110 is greater than the dimension of the length in the extension direction.

This can make the amount of displacement of the beam portion 110 large and improve the device characteristics of the piezoelectric device 100.

In the present preferred embodiment, seen from the layering direction, the area of the opposing region in which the first electrode layer 12 is opposed to the second electrode layer 13 in the beam portion 110 is, for example, about 90% or more of the area of the beam portion 110.

This can improve the electromechanical coupling coefficient of the beam portion 110 as a vibrator. It in turn can improve the device characteristics of the piezoelectric device 100.

In the present preferred embodiment, seen from the layering direction, the area of the opposing region in which the first electrode layer 12 is opposed to the second electrode layer 13 in the beam portion 110 is about 90% or more of the area of the first electrode layer 12 and about 90% or more of the area of the second electrode layer 13.

This can make the area of the opposing region in the beam portion 110 large, so that the electromechanical coupling coefficient of the beam portion 110 as a vibrator can be improved and hence the device characteristics of the piezoelectric device 100 can be improved.

In the present preferred embodiment, the piezoelectric layer 11 is formed of monocrystal material. The thermal expansion coefficient of the piezoelectric layer 11 has anisotropy in the in-plane direction of the plane orthogonal to the layering direction. The thermal expansion coefficient of the piezoelectric layer 11 in the extension direction is smaller than the thermal expansion coefficient of the piezoelectric layer 11 in the direction that is within the in-plane direction and is orthogonal to the extension direction.

Since this can suppress warping of the beam portion 110 when the beam portion 110 is heated, the clearance 125 between the beam portion 110 and the base 120 as seen from the layering direction can be prevented from widening due to warping of the beam portion 110. It in turn can stabilize the device characteristics of the piezoelectric device 100 regardless the temperature of the beam portion 110.

In the present preferred embodiment, the piezoelectric layer 11 is formed of lithium niobate ($LiNbO_3$) or lithium tantalate ($LiTaO_3$).

This can improve piezoelectricity of the piezoelectric layer 11, so that the device characteristics of the piezoelectric device 100 can be improved.

In the present preferred embodiment, the base 120 includes the first connection electrode 121 and the second connection electrode 122. The first connection electrode 121 is electrically connected to the first electrode layer 12 while being exposed to outside. The second connection electrode 122 is electrically connected to the second electrode layer 13 while being exposed to outside. The first connection electrode 121 and the second connection electrode 122 are located in the base 120 on the fixed end portion 111 side with respect to the beam portion 110.

This can shorten a conduction path that connects the first electrode layer 12 and the second electrode layer 13 located in the beam portion 110 with the first connection electrode 121 and the second connection electrode 122, and can lower an electrical resistivity of the piezoelectric device 100.

In the present preferred embodiment, the length, in the extension direction, of the portion of the base 120 that is located on the free end portion 112 side with respect to the beam portion 110 is shorter than the length, in the extension direction, of the portion that is located on the fixed end portion 111 side with respect to the beam portion 110.

This can make the piezoelectric device 100 compact while providing the piezoelectric device 100 with the first connection electrode 121 and the second connection electrode 122.

The piezoelectric device 100 according to the present preferred embodiment further includes the base supporting portion 130 and the cavity 140. The base supporting portion 130 is connected to one side of the base 120. The base supporting portion 130 has an annular outline along the base 120 as seen from the layering direction. The cavity 140 is open to the opposite side to the beam portion 110 side by being surrounded by the beam portion 110 and the base supporting portion 130.

This provides the piezoelectric device 100 with a structure in which a membrane shape is supported by the base supporting portion 130, facilitating mounting onto a substrate.

In the present preferred embodiment, the multilayer body 10 defines at least a portion of the base 120 continuously from the beam portion 110. This allows the piezoelectric device 100 to have a simplified configuration.

Second Preferred Embodiment

A piezoelectric device according to a second preferred embodiment of the present invention is now described. The piezoelectric device according to the second preferred embodiment of the present invention has a different outline of the beam portion as seen from the layering direction from the outline of the beam portion 110 of the piezoelectric device 100 according to the first preferred embodiment of the present invention. Accordingly, the same or similar configurations as those of the piezoelectric device 100 according to the first preferred embodiment of the present invention will not be described again.

Figure 21:
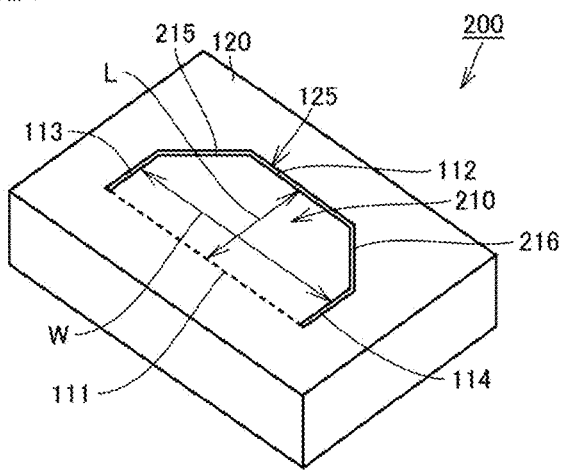
FIG. 21 is a perspective view showing a piezoelectric device according to a second preferred embodiment of the present invention.

FIG. 21 is a perspective view showing the piezoelectric device according to the second preferred embodiment of the present invention. As shown in FIG. 21, in a piezoelectric device 200 according to the second preferred embodiment of the present invention, the free end portion 112 is located inside the fixed end portion 111 in the orthogonal or substantially orthogonal direction.

In the present preferred embodiment, a beam portion 210 further includes a first oblique portion 215 and a second oblique portion 216. The first oblique portion 215 extends from the end of the first-side end portion 113 opposite to the fixed end portion 111 side toward one end of the free end portion 112 in a direction intersecting with each of the extension direction and the orthogonal or substantially orthogonal direction. The second oblique portion 216 extends from the end of the second-side end portion 114 opposite the fixed end portion 111 side toward the other end of the free end portion 112 in a direction intersecting with each of the extension direction and the orthogonal or substantially orthogonal direction.

Figure 22:
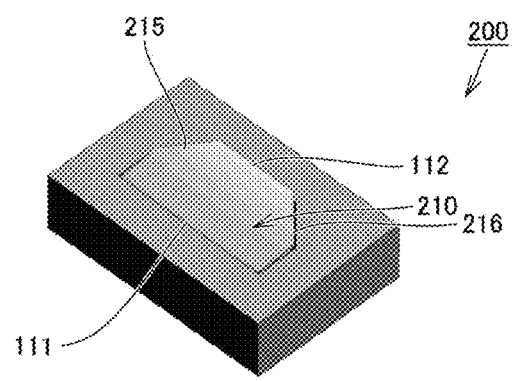
FIG. 22 is a perspective view showing a state of vibrating in the fundamental vibration mode by simulation for the piezoelectric device according to the second preferred embodiment of the present invention.
Figure 23:
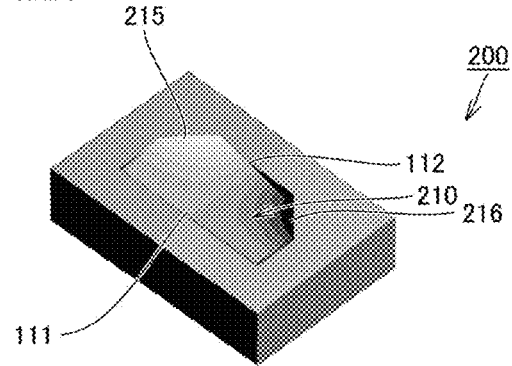
FIG. 23 is a perspective view showing a state of vibrating in the unwanted mode by simulation for the piezoelectric device according to the second preferred embodiment of the present invention.

FIG. 22 is a perspective view showing a state of vibrating in the fundamental vibration mode by simulation for the piezoelectric device according to the second preferred embodiment of the present invention. FIG. 23 is a perspective view showing a state of vibrating in the unwanted mode by simulation for the piezoelectric device according to the second preferred embodiment of the present invention. As shown in FIGS. 22 and 23, similar to the piezoelectric device 100 according to the first preferred embodiment of the present invention, the free end portion 112 of the piezoelectric device 200 according to the second preferred embodiment of the present invention is similarly displaced over the orthogonal or substantially orthogonal direction in the fundamental vibration mode, while in the unwanted mode, one end and the other end of the free end portion 112 in the orthogonal or substantially orthogonal direction are displaced in different directions from each other. The resonant frequency of the fundamental vibration mode in the present preferred embodiment is the same or substantially the same as the resonant frequency of the fundamental vibration mode of the piezoelectric device 100 according to the first preferred embodiment of the present invention.

However, as shown in FIG. 23, in the unwanted mode of the present preferred embodiment, the difference between the positions of one end and the other end of the free end portion 112 in the layering direction is smaller than that in the unwanted mode of the piezoelectric device 100 according to the first preferred embodiment of the present invention shown in FIG. 10. Thus, in the unwanted mode of the piezoelectric device 200 according to the second preferred embodiment of the present invention, inertia components of the beam portion 210 are removed compared to in the unwanted mode in the first preferred embodiment of the present invention due to the presence of the first oblique portion 215 and the second oblique portion 216 described above. Due to the removal of the inertia components, the resonant frequency in the unwanted mode of the piezoelectric device 200 according to the second preferred embodiment of the present invention is higher than the resonant frequency of the unwanted mode in the first preferred embodiment of the present invention. As a result, in the second preferred embodiment of the present invention, the absolute value of the difference between the resonant frequency of the beam portion 210 in the fundamental vibration mode and the resonant frequency in the unwanted mode is larger than that in the first preferred embodiment of the present invention.

In the present preferred embodiment, the first oblique portion 215 and the second oblique portion 216 described above can further increase the absolute value of the difference between the resonant frequency of the beam portion 210 in the fundamental vibration mode and the resonant frequency in the unwanted mode. Thus, when a sinusoidal voltage with multiple frequency components is applied to the piezoelectric device 200, the device characteristics of the piezoelectric device 200 can be made higher compared to the piezoelectric device 100 according to the first preferred embodiment of the present invention and operation can be stabilized. Moreover, since excessive upward warping of corners of the beam portion 210 due to, for example, internal or thermal stress of the beam portion 210 can be reduced or prevented, the clearance 125 between the beam portion 210 and the base 120 can be kept from widening. Thus, the device characteristics of the piezoelectric device 200 can be stabilized.

Each of the first oblique portion 215 and the second oblique portion 216 may be linear or curved, for example.

In the present preferred embodiment, seen from the layering direction, the average of the dimension of the width W of the beam portion 210 in the orthogonal or substantially orthogonal direction to the extension direction of the beam portion 210 is greater than the maximal dimension of the length L thereof in the extension direction. Thus, for the piezoelectric device 200, the device characteristics can be improved while reducing or preventing change in the resonant frequency of the beam portion 210.

Third Preferred Embodiment

A piezoelectric device according to a third preferred embodiment of the present invention is now described. The piezoelectric device according to the third preferred embodiment of the present invention differs from the piezoelectric device 100 according to the first preferred embodiment of the present invention in that a reinforcement member is included. Accordingly, the same or similar configurations as those of the piezoelectric device 100 according to the first preferred embodiment of the present invention will not be described again.

Figure 24:
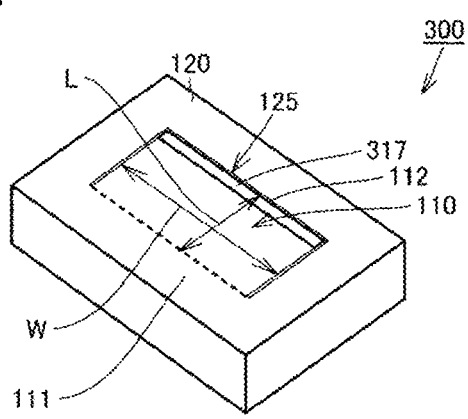
FIG. 24 is a perspective view showing a piezoelectric device according to a third preferred embodiment of the present invention.
Figure 25:
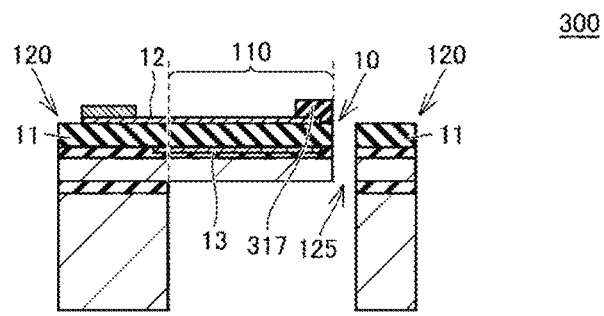
FIG. 25 is a sectional view showing the piezoelectric device according to the third preferred embodiment of the present invention.

FIG. 24 is a perspective view showing the piezoelectric device according to the third preferred embodiment of the present invention. FIG. 25 is a sectional view showing the piezoelectric device according to the third preferred embodiment of the present invention.

As shown in FIGS. 24 and 25, a piezoelectric device 300 according to the third preferred embodiment of the present invention includes a reinforcement member 317 provided in the beam portion 110 on the free end portion 112 side relative to the center in the extension direction. This can reduce or prevent vibration in the unwanted vibration mode while not hindering vibration in the fundamental vibration mode. As a result, the absolute value of the difference between the resonant frequency of the fundamental vibration mode and the resonant frequency of the unwanted vibration mode can be large and the device characteristics of the piezoelectric device 300 can be improved. Moreover, since excessive upward warping of corners of the beam portion 110 due to, for example, internal or thermal stress of the beam portion 110 can be reduced or prevented, the clearance 125 between the beam portion 110 and the base 120 can be prevented from widening. Thus, the device characteristics of the piezoelectric device 300 can be stabilized. In the present preferred embodiment, the reinforcement member 317 is provided on the free end portion 112 in the beam portion 110.

The reinforcement member 317 is located in the free end portion 112 so as to extend in the orthogonal or substantially orthogonal direction. Specifically, the reinforcement member 317 extends from one end through the other end of the free end portion 112. The reinforcement member 317 preferably has a small width dimension in the extension direction of the beam portion 110 from a viewpoint of not interfering with the vibration of the beam portion 110 in the fundamental vibration mode.

The reinforcement member 317 is preferably made of light-weight and hard material. The reinforcement member 317 is made of $Si_3N_4$, $Al_2O_3$, or AlN, for example.

In the present preferred embodiment, seen from the layering direction, the average of the dimension of the width W of the beam portion 110 in the orthogonal or substantially orthogonal direction to the extension direction of the beam portion 110 is greater than the maximal dimension of the length L thereof in the extension direction. Thus, for the piezoelectric device 300, the device characteristics can be improved while reducing or preventing changes in the resonant frequency of the beam portion 110.

In the description of the preferred embodiments of the present invention above, compatible configurations may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a single beam portion including a multilayer body, a fixed end portion, and a free end portion opposite top the fixed end portion, the beam portion extending from the fixed end portion towards the free end portion; and
   an annular base connected with the fixed end portion of the beam portion, and as viewed from a layering direction of the multilayer body, surrounding the beam portion at an interval from the beam portion except for the fixed end portion; wherein
   the multilayer body includes a piezoelectric layer, a first electrode layer on one side of the piezoelectric layer, and a second electrode layer opposed to at least a portion of the first electrode layer across the piezoelectric layer; and
   as viewed from the layering direction, an average of a dimension of a width of the beam portion in an orthogonal or substantially orthogonal direction to an extension direction of the beam portion is greater than a maximal dimension of a length thereof in the extension direction, and
   wherein as viewed from the layering direction, the fixed end portion and the free end portion are parallel or substantially parallel to each other, and the free end portion is inside the fixed end portion in the orthogonal or substantially orthogonal direction; and
   the beam portion further includes:
      a first-side end portion extending from one end of the fixed end portion linearly along the extension direction;
      a second-side end portion extending from another end of the fixed end portion linearly along the extension direction;
      a first oblique portion extending from an end of the first-side end portion opposite to the fixed end portion side toward one end of the free end portion in a direction intersecting with each of the extension direction and the orthogonal or substantially orthogonal direction; and
      a second oblique portion extending from an end of the second-side end portion opposite the fixed end portion side toward another end of the free end portion in a direction intersecting with each of the extension direction and the orthogonal or substantially orthogonal direction.

2. The piezoelectric device according to claim 1, wherein as viewed from the layering direction, a dimension of a width of the fixed end portion in the orthogonal or substantially orthogonal direction is greater than the maximal dimension of the length of the beam portion in the extension direction.

3. The piezoelectric device according to claim 1, wherein as viewed from the layering direction, a dimension of a width of the fixed end portion in the orthogonal or substantially orthogonal direction is substantially 90% or more of a dimension of a width of the free end portion in the orthogonal or substantially orthogonal direction.

4. The piezoelectric device according to claim 1, wherein as viewed from the layering direction, the beam portion has a rectangular or substantially orthogonal outline with sides parallel or substantially parallel to the extension direction.

5. The piezoelectric device according to claim 4, wherein as viewed from the layering direction, the average of the dimension of the width of the beam portion in the orthogonal or substantially orthogonal direction is substantially 3.25 times the maximal dimension of the length of the beam portion in the extension direction or smaller.

6. The piezoelectric device according to claim 1, wherein a reinforcement member is provided in the beam portion on the free end portion side.

7. The piezoelectric device according to claim 1, wherein in an opposing region in which the first electrode layer opposed the second electrode layer in the beam portion, an average of a dimension of a width in the orthogonal or substantially orthogonal direction to the extension direction of the beam portion is greater than a dimension of a length in the extension direction.

8. The piezoelectric device according to claim 1, wherein as viewed from the layering direction, an area of an opposing region in which the first electrode layer opposes the second electrode layer in the beam portion is substantially 90% or more of an area of the beam portion.

9. The piezoelectric device according to claim 1, wherein as viewed from the layering direction, an area of an opposing region in which the first electrode layer opposes the second electrode layer in the beam portion is substantially 90% or more of an area of the first electrode layer and substantially 90% or more of an area of the second electrode layer.

10. The piezoelectric device according to claim 1, wherein
the piezoelectric layer includes a monocrystal material;
a thermal expansion coefficient of the piezoelectric layer has anisotropy in an in-plane direction of a plane orthogonal or substantially orthogonal to the layering direction; and
the thermal expansion coefficient of the piezoelectric layer in the extension direction is smaller than the thermal expansion coefficient of the piezoelectric layer in a direction that is within the in-plane direction and is orthogonal or substantially orthogonal to the extension direction.

11. The piezoelectric device according to claim 1, wherein the piezoelectric layer includes lithium niobate or lithium tantalate.

12. The piezoelectric device according to claim 1, wherein
the base includes a first connection electrode electrically connected to the first electrode layer while being exposed to an outside, and a second connection electrode electrically connected to the second electrode layer while being exposed to an outside; and
the first connection electrode and the second connection electrode are in the base on the fixed end portion side with respect to the beam portion.

13. The piezoelectric device according to claim 12, wherein a length, in the extension direction, of a portion of the base that is on the free end portion side with respect to the beam portion is shorter than a length, in the extension direction, of a portion that is on the fixed end portion side with respect to the beam portion.

14. The piezoelectric device according to claim 1, further comprising:
a base supporting portion connected to one side of the base and having an annular outline along the base as seen from the layering direction; and
a cavity open to an opposite side to the beam portion side by being surrounded by the beam portion and the base supporting portion.

15. The piezoelectric device according to claim 1, wherein the multilayer body defines at least a portion of the base continuously from the beam portion.

* * * * *